United States Patent [19]

Coors

[11] Patent Number: 5,073,840
[45] Date of Patent: Dec. 17, 1991

[54] CIRCUIT BOARD WITH COATED METAL SUPPORT STRUCTURE AND METHOD FOR MAKING SAME

[75] Inventor: William G. Coors, Golden, Colo.

[73] Assignee: Microlithics Corporation, Golden, Colo.

[21] Appl. No.: 254,494

[22] Filed: Oct. 6, 1988

[51] Int. Cl.⁵ .............................................. H05K 7/02
[52] U.S. Cl. .................................. 361/400; 361/388; 361/414; 361/410; 174/255; 101/129; 428/450
[58] Field of Search ............... 361/386, 388, 389, 400, 361/410, 414, 403; 174/255, 256, 258, 260, 264; 428/450, 472.2; 101/129

[56] References Cited

U.S. PATENT DOCUMENTS

| | | |
|---|---|---|
| 3,165,672 | 1/1965 | Gellert . |
| 3,202,591 | 8/1965 | Curran . |
| 3,296,099 | 1/1967 | Dinella . |
| 3,334,395 | 8/1967 | Cook et al. . |
| 3,514,538 | 5/1970 | Chadwick et al. . |
| 3,873,756 | 3/1975 | Gall et al. . |
| 3,934,334 | 1/1976 | Hanni . |
| 4,248,075 | 2/1981 | Whitley . |
| 4,254,172 | 3/1981 | Takahashi et al. . |
| 4,256,796 | 3/1981 | Hang et al. . |
| 4,328,614 | 5/1982 | Schelhorn . |
| 4,355,115 | 10/1982 | Hang et al. . |
| 4,365,168 | 12/1982 | Chaput et al. . |
| 4,383,270 | 5/1983 | Schelhorn . |
| 4,420,364 | 12/1983 | Nukii et al. . |
| 4,424,251 | 1/1984 | Sugishita et al. ................ 174/258 |
| 4,496,793 | 1/1985 | Hanson et al. . |
| 4,509,096 | 4/1985 | Baldwin et al. . |
| 4,677,252 | 6/1987 | Takahashi . |
| 4,679,122 | 7/1987 | Belke, Jr. . |
| 4,700,273 | 10/1987 | Kaufman . |
| 4,811,166 | 3/1989 | Alvarez et al. ................ 361/386 |
| 4,882,454 | 11/1989 | Peterson et al. ................ 361/386 |
| 4,997,698 | 3/1991 | Oboodi et al. ................ 428/450 X |

FOREIGN PATENT DOCUMENTS

| | | |
|---|---|---|
| 0224922 | 6/1987 | European Pat. Off. . |
| 0228017 | 7/1987 | European Pat. Off. . |
| 2511193 | 2/1983 | France . |
| 61-295692 | 12/1986 | Japan . |
| 61-295693 | 12/1986 | Japan . |

OTHER PUBLICATIONS

Surface-Mount Substrates: The Key in Going Leadless, Markstein, Electronic Packaging and Production, pp. 50-55, Jun. 1983.
Thick-Film, Multi-Layer, Chip-Carrier Circuit Fabrication on Porcelainized Metal-Core Substrates, Schelhorn, National Electronics Packaging and Production Conference (1982), pp. 81-86.
Low Cost, Increased Packaging Density with Molybdenum Substrate, Turski et al., Proceedings of the International Society for Hybrid Microelectronics (Oct. 1981), pp. 353-358.
Study of Thick Film on Stainless Steel Board, Egawa et al., Shoei Chemical, Inc., Tokyo, Japan, pp. 202-203.
High Temperature Porcelain-Coated Copper-Clad Invar Substrates, Hang, et al., RCA Laboratories, Princeton, N.J., Proceedings of International Microelectronics Conference, May 1984.

Primary Examiner—Leo P. Picard
Assistant Examiner—Paramita Ghosh
Attorney, Agent, or Firm—Sheridan Ross & McIntosh

[57] ABSTRACT

A circuit board is provided having an electrically conductive substrate. Preferably, the electrically conductive substrate comprises molybdenum and copper. The substrate is selectively coated with a dielectric material which is capable of withstanding volatilization at high temperatures. The coefficient of thermal expansion of the substrate is substantially equal to that of the circuitry components which are placed thereon. A method of providing such a support structure is also disclosed.

69 Claims, 3 Drawing Sheets

CIRCUIT BOARD WITH COATED METAL SUPPORT STRUCTURE AND METHOD FOR MAKING SAME

FIELD OF THE INVENTION

The present invention relates to the field of circuit board, and in particular, to circuit boards having coated metal support structures.

BACKGROUND INFORMATION

Circuit boards, comprising a conducting material on the surface of an insulating material, are well-known. One method of making such circuit boards includes providing a rigid substrate with a ground plane and an insulating dielectric layer, and selectively applying conductive material to the insulating layer in the form of a circuit. An electrical connection between the ground plane and the circuit can be made, for example, by drilling a hole through the insulating layer and providing an electrical contact between the ground plane and the conductive material.

The circuitry can comprise various elements including, for example, (1) electrically conductive pathways, e.g. electrically conductive printed circuits formed by thick film technology, and (2) circuitry components such as (a) discrete electronic components, e.g. integrated circuits, resistors, capacitors, etc., and (b) devices employed to interconnect the conductive pathways and the discrete electronic components, e.g. leadless ceramic chip carriers.

Many interconnection devices used in the past had a compliant lead connecting the component to a printed circuit. Because of the compliancy of the lead, thermal expansion was not a critical factor because differences in thermal expansion between the substrate and the device could be handled by the flexing of the compliant lead. More recently, it has become desirable to employ leadless carriers, such as leadless ceramic chip carriers made of alumina a beryllia.

Because the leadless chip carriers are typically directly soldered to the circuit board, there is little or no flexibility to provide for differential thermal expansion. Therefore, as the circuit board expands and contracts with heating and cooling, the solder joints which connect the leadless ceramic chip carrier to the conductive pathways will be placed under stress due to the thermal expansion rate difference between the chip carrier and the substrate. The stress can cause the solder joints to weaken and crack. Additionally, the thermal expansion differential can cause the various layers which make up the circuit board to separate. These problems are exacerbated by dense circuitry which not only generates greater heat but, because of the fineness of the circuit elements, is more susceptible to damage from differences between the linear coefficients of thermal expansion of the various circuit board materials.

As used herein, the term "linear coefficient of thermal expansion" will be understood to mean the ratio of the change in length of an object per ° C. change in temperature to the length of the object at 0° C. The value of the coefficient varies with temperature. Therefore, unless otherwise indicated, the values listed herein will be calculated at 25° C. and will be expressed in terms of units of expansion per million units per ° C. (ppm/° C.).

Another problem typically encountered with prior printed circuits is heat dissipation. In the past, rigid substrates comprising ceramic materials or other materials which have low heat conduction rates have been employed. As a result, generated heat cannot readily dissipate. Therefore, it would be advantageous to have a substrate with a high thermal conductivity in order to avoid the build-up of heat.

In connection with both the thermal expansion and thermal conductivity problems of previous substrates, the problems become more acute as more and more electronic components are placed on circuit boards. The greater density of electronic components, typically creates a greater amount of heat during operation.

Previous approaches, as described, e.g., in U.S. Pat. No. 4,679,122 by Belke, Jr. et al., issued July 7, 1987; U.S. Pat. No. 3,873,756 by Gall, et al., issued Mar. 25, 1975; U.S. Pat. No. 3,514,538 by Chadwick, et al., issued May 26, 1970; and U.S. Pat. No. 3,334,395 by Cook, et al., issued Aug. 8, 1967, have recognized that superior thermal conductivity can be realized by employing metallic substrates, e.g. aluminum substrates. However, these references do not address the problems resulting from differences in thermal expansion between the circuit components and the substrate. Additionally, the substrates disclosed in these patents include layers of organic materials which cannot withstand high temperatures, such as those employed in thick film processes.

U.S. Pat. No. 3,165,672 by Gellert, issued Jan. 12, 1965, discloses that there is a disparity in coefficients of thermal expansion between metallic circuitry and plastic substrate materials and that plastic substrate materials are undesirable because of their typically poor thermal conductivity, which results in inferior heat dissipation. In order to overcome these problems with plastic substrates, Gellert discloses a substrate comprising a metal core, preferably aluminum, coated with a dielectric material. Circuits are formed on the dielectric layer by an acid etching process. However, in order to connect electrical components to the circuits, holes are drilled through the metal substrate. The holes are filled with an epoxy material. Epoxy materials typically melt, vaporize, oxidize or otherwise degrade at temperatures greater than about 400° C., making them unsuitable for use in connection with high-temperature fabrication processes, such as thick film technologies. The sintering or firing temperatures employed in a thick film process typically reach 900° C. to 1000° C.

U.S. Pat. No. 4,700,273 by Kaufman, issued Oct. 13, 1987, discloses a method for accounting for the thermal expansion of a silicon chip by interposing a layer of molybdenum between a ceramic substrate and the silicon chip. However, the ceramic substrate itself is a poor thermal conductor and therefore heat cannot readily dissipate.

U.S. Pat. No. 4,496,793 by Hanson et al., issued Jan. 29, 1985, recognizes the problems encountered when leadless carriers are mounted on a substrate having a coefficient of thermal expansion different than that of the leadless carriers. Hanson et al. disclose matching the coefficient of thermal expansion of a substrate to that of a carrier by producing a laminate substrate with stabilizing layers of a metal having a coefficient of thermal expansion less than that of the laminate structure as a whole. The laminate structure includes bonding sheets which are formed of resin impregnated glasscloth. This type of approach is not desirable in a thick film printed circuit environment because the resin impregnated glass cloth can volatilize during the thick film sintering process.

A number of patents which disclose employing metallic substrates employ organic dielectric materials to coat the substrates. For example, U.S. Pat. No. 4,254,172 by Takahashi et al., issued Mar. 3, 1981; U.S. Pat. No. 4,679,122 by Belke, Jr. et al., issued July 7, 1987; and U.S. Pat. No. 4,677,252 by Takahashi et al., issued June 30, 1987, all disclose employing resins in the dielectric layer. U.S. Pat. No. 4,420,364 by Nukii et al., issued Dec. 13, 1983, discloses using a polyamic acid film or a polyamideimide film for a dielectric layer. As pointed out hereinbefore, a problem encountered with such organic materials is that they will not withstand the high temperatures encountered in thick film processes. U.S. Pat. No. 3,934,334 by Hanni, issued Jan. 27, 1976, discloses coating a metallic substrate with an electrostatic powder and curing at less than 500° F. (260° C.). These substrates, as described, are also used in connection with a non-high temperature procedure.

U.S. Pat. No. 4,365,168 by Chaput et al., issued Dec. 21, 1982, discloses a porcelain-coated metal (e.g. steel) substrate. The substrate can act as a ground plane. Printed circuitry can be applied to the porcelain-coated metal substrate by thick film techniques. However, problems caused by differential thermal expansion are not addressed by Chaput et al. The disclosed metal substrate material, steel, has a high coefficient of thermal expansion relative to, for example, alumina. This results in problems due to unequal thermal expansion when alumina leadless chip carriers are employed.

A number of patents disclose employing electrical connections to a metallic substrate. U.S. Pat. No. 3,296,099 by Dinella, issued Jan. 3, 1967, discloses a terminal region on a metallic substrate provided to make possible a common ground return for the printed circuit. The terminal region can be provided by masking the area, followed by the application of an epoxy resin or a polymeric thermoplastic resin. Alternatively, the terminal region can be provided by tapping, drilling or screwing a metal terminal through the resin insulation layer. However, the employment of a resin insulating layer precludes the use of high temperature thick film processes.

U.S. Pat. No. 3,202,591 by Curran, issued Aug. 24, 1965, discloses connecting electrical circuitry to a metal base by means of an aperture through the base so that the base may be grounded. The metal base is insulated by an electrolytically formed porous oxide layer on its surface. The aperture may be formed by masking, punching or otherwise forming a hole in the oxide layer. However, the electrolytically deposited oxide layer has porosity defects which must be treated with a silicon material in order to maintain the integrity of the insulating layer.

U.S. Pat. No. 4,328,614 by Schelhorn, issued May 11, 1982, discloses using a metal core as a common ground plane. However, the Schelhorn reference discloses the use of low carbon steel as the core material. As already pointed out, steel has a relatively high coefficient of thermal expansion.

In a paper entitled "Study of Thick Film on Stainless Steel Board", by Egawa et al., a method for producing a substrate by screen printing and sintering a glass paste on a steel core is disclosed. The problems encountered when steel cores are employed are discussed in the articles "Metal Core Materials for Thick Film Substrate Applications" by Schelhorn and "High Temperature Porcelain-Coated Copper-Clad Invar Substrates" by Hang et al. In particular, the steel core substrates are shown to have coefficients of thermal expansion which are considerably higher than 94%-96% pure alumina. Thermal cycling tests demonstrate that the expansion differential results in solder joint failure when alumina leadless chip carriers are soldered to porcelain-coated steel substrates.

In order to alleviate the problems inherent with the use of steel core substrates, Schelhorn and Hang et al. disclose the use of porcelain-coated copper-clad Invar (TM) as a circuit board support structure. The disclosed metal substrates have coefficients of thermal expansion which are relatively close to those of the porcelain coating at lower temperatures, e.g. from room temperature to about 200° C. However, at higher temperatures the coefficient of thermal expansion for copperclad Invar (TM) substrates rises at a faster, non-linear rate than the coefficient for the porcelain coating, and reaches values similar to steel at about 800° C. This non-linear behavior makes the design of a porcelain coating for a copper-clad Invar (TM) substrate difficult, because the coefficient of thermal expansion for the substrate is much higher than that for the coating at temperatures typically encountered during firing of the coating.

Therefore, it would be advantageous to have a circuit board which minimizes the problems associated with differential thermal expansion. In particular, it would be advantageous to have a substrate with a rate of thermal expansion which both approximates that for circuitry component materials such as alumina at operating temperatures, e.g. from about −55° to about 125° C., and approximates that for dielectric materials at higher temperatures, e.g. above 200° C. Additionally, it would be advantageous to have an electrically conductive substrate so as to eliminate the need for an additional ground layer. In connection with the electrically conductive substrate, it would be advantageous to provide means for electrically connecting the circuitry to the substrate, while avoiding the need for drilling a hole through the insulating layer. Furthermore, it would be advantageous if the above-mentioned advantages could be employed on a circuit board prepared by a thick film process. Therefore, it would be advantageous if the electrically conductive substrate and the dielectric insulating layer could withstand high temperatures.

SUMMARY OF THE INVENTION

In accordance with the present invention, a circuit board support structure is provided. The support structure includes an electrically conductive substrate, which is preferably chiefly copper-clad molybdenum. The electrically conductive substrate is selectively coated with a dielectric material. Preferably the substrate and dielectric material can be heated to temperatures in excess of 400° C. and preferably 900° C. or higher, without substantial volatilization or other degradation. Electric circuitry is provided, which can be insulated from the substrate at the areas which are selectively coated with dielectric material. The circuitry can be in electrical contact with the electrically conductive substrate at areas which are not coated with dielectric material. In order to minimize problems associated with expansion caused by heating and contraction due to cooling, the linear coefficent of thermal expansion of the substrate is substantially equal to that of the circuitry components and, in particular, to connection devices such as leadless chip carriers. Preferably, the linear coefficient of thermal expansion of the dielectric material is also substantially equal to that of the substrate and circuitry.

In accordance with the present invention, a method for producing electric circuitry on a support structure is also provided. According to the method of the present invention, an electrically conductive substrate is provided. The effective linear coefficient of thermal expansion of the electrically conductive substrate is selected to closely approximate that of the circuitry. A dielectric layer is applied to selected portions of the electrically conductive substrate, in order to provide exposed areas free of dielectric material. For present purposes, the exposed areas on the electrically conductive substrate will be referred to as "vias". The dielectric material is fired at a high temperature in order to bond it to the substrate. Circuitry is placed so as to electrically contact the electrically conductive substrate at the vias and, at other selected areas, to be electrically insulated from the substrate areas by the dielectric material.

The support structure of the present invention provides a number of advantages. By matching the linear coefficient of thermal expansion of the electrically conductive substrate with that of at least some of the circuitry components, damage caused by unequal expansion and contraction as a result of heating and cooling can be minimized. Additionally, by selectively applying the dielectric material to the substrate, the need for subsequent removal of dielectric material, in order to establish electrical contact between the components and the substrate, can be avoided. Because the dielectric material does not volatilize at high temperatures, the present apparatus can be fired at high temperatures. Because the electrically conductive substrate of the present invention is preferably a metal, it can be formed into a variety of shapes. A metal substrate can also be drilled, brazed and glued more easily than, e.g., ceramic substrates. A metal substrate can be bolted or otherwise compressionally held in place, e.g., in an electronic device, using compression which typically causes a ceramic piece to fracture. The substrate of the present invention also posseses a high thermal conductivity, and therefore, is capable of increased dissipation of heat. Because the substrate is electrically conductive, the need for an additional conductive layer is eliminated.

DETAILED DESCRIPTION OF THE INVENTION

The present invention will be described with reference to FIG. 1. The electrically conductive substrate 10 preferably comprises a multi-layer structure. The middle layer 12 of the electrically conductive substrate 10 preferably comprises a metal, and most preferably is molybdenum. Additional optional layers 14 and 16 are also preferably metals, and most preferably comprise copper. The total thickness for the electrically conductive substrate 10 is preferably between about 0.01 and about 0.05 inches. In the preferred embodiment, the copper layers are preferably between about 0.001 and about 0.01 inches thick. This structure is available from Climax Specialty Metals Co., Coldwater, Mich., in bulk sheet form which can be trimmed to the desired size. Such a substrate has an effective linear coefficient of thermal expansion of about 5.5 to about 7 ppm/° C.

A multi-layer electrically conductive substrate is preferred because, by proper choice of the thickness and composition of the layers, it is possible to obtain an electrically conductive substrate having the desired effective linear coefficient of thermal expansion. Although the individual components of the substrate, such as a molybdenum layer or a copper layer, will have linear coefficients of thermal expansion characteristic of their composition, the bonded layered substrate will have an effective linear coefficient of thermal expansion which will be different from and, typically, intermediate of those of the components. Specifically, although molybdenum has a linear coefficient of thermal expansion of about 5 ppm/° C., and copper has a linear coefficient of thermal expansion of about 16.6 ppm/° C., the molybdenum-copper combination is designed to have an effective linear coefficient of thermal expansion of about 5 ppm/° C. to about 10 ppm/° C., preferably about 5 ppm/° C. to about 8 ppm/° C., more preferably between about 5.5 ppm/° C. to about 7 ppm/° C., and most preferably about 6.3 ppm/° C., which is the coefficient of thermal expansion of 94% pure alumina.

A dielectric material is selectively applied to the electrically conductive substrate 10 to form a dielectric layer 18. Preferably, the dielectric material is a glass, ceramic or a mixture thereof. A preferred method for producing the dielectric layer 18 is to selectively apply a finely divided dielectric material, for example, by silk screening. A preferred dielectric material is borosilicate glass with alumina filler, such as DuPont 4575, available from E.I. DuPont de Nemours Company, Wilmington, Del. Selected areas which do not receive dielectric material, shown as vias 22 and 26, provide for electrical contact between the electrically conductive substrate 10 and subsequently applied circuitry. It is also possible to provide a dielectric layer without such vias.

Preferably, the linear coefficient of thermal expansion of the dielectric layer 18 is substantially matched to the linear coefficient of thermal expansion for the electrically conductive substrate 10 and the subsequently applied circuitry and, in particular, leadless chip carriers 38 (shown in FIG. 2). The substrate 10 and leadless chip carriers 38 should have sufficiently similar linear coefficients of thermal expansion over the range of operating temperatures (such as within plus or minus about 1 ppm/° C.) in order that delamination, cracking or other electrically adverse effects are reduced or eliminated.

Because the linear coefficient of thermal expansion for a material will vary with temperature, an important consideration is whether the linear coefficients of thermal expansion for the respective materials will vary consistently over the range of operating temperatures. Preferably, the linear coefficents of thermal expansion should not differ by more than about 2 and preferably not more than about 1 part per million per ° C. up to the sintering temperature for the dielectric material and/or the circuitry firing temperature.

A disadvantage with prior art devices which employed copper-clad Invar (TM) substrates is that the coefficient of thermal expansion for the substrate deviates from that of the dielectric layer at higher temperatures, for example, temperatures over 200° C. The coefficients of thermal expansion for the substrates of the present invention substantially match that of the glass-/alumina dielectric layer 18 at temperatures employed during firing (e.g. up to about 1000° C.) as well as that of connection devices, such as leadless chip carriers, over the typical range of operating temperatures (e.g. from about −55° to about 125° C.).

In a preferred method for applying the dielectric layer 18, the dielectric material is finely divided and mixed with an organic binder. Generally, the dielectric material can be any material which is sufficiently insulating and preferably has a linear coefficient of thermal expansion which is within plus or minus 1 part per million per ° C. of that of the substrate and/or circuitry components. The dielectric material should be adhesive or attachable to the substrate, e.g., by oxide bonds. Additionally, the dielectric material should have a suitable glass transition temperature for purposes of firing, and should be sufficiently dielectric (i.e., should have a high dielectric withstanding voltage). Preferably, the thickness of the dielectric layer 18 is between about 0.001 and about 0.003 inches.

In a preferred embodiment, the dielectric material comprises borosilicate glass with alumina filler. Preferably, a mixture of dielectric material and solvents and binders are silk-screened onto the substrate 10. After air drying, the material is about 0.0015 inches thick. The material is then fired at a temperature above its glass transition temperature after which it is about 0.0012 inches thick. During the firing process the solvents and binders can volatilize but the dielectric material will not volatilize to any substantial degree. A preferred range of firing temperatures is from about 800° C. to about 950° C.

Figure 1:
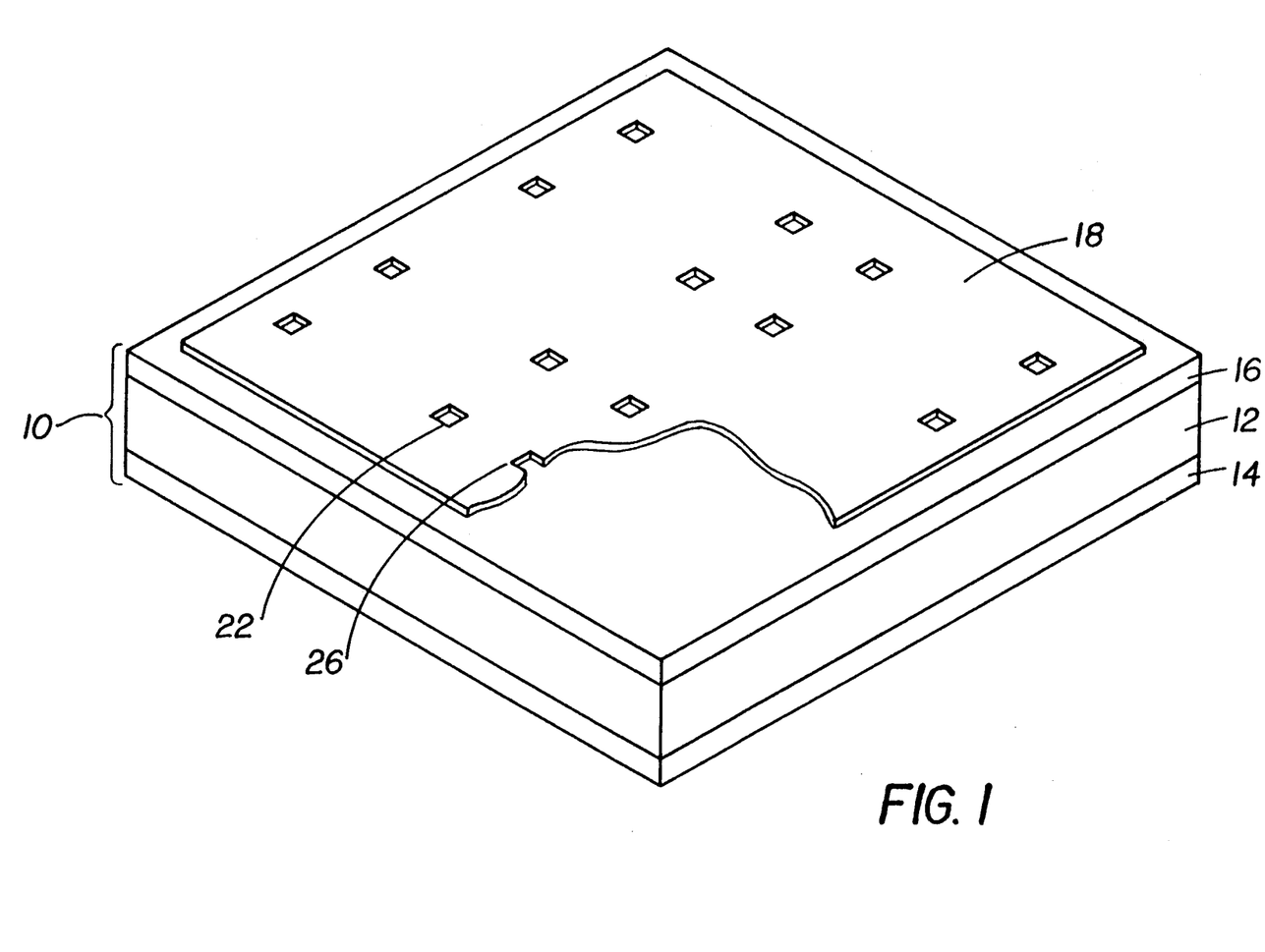
FIG. 1 illustrates a perspective view of one embodiment of the support structure of the present invention showing a substrate and a partially cut-away dielectric layer, including vias formed thereon.
Figure 2:
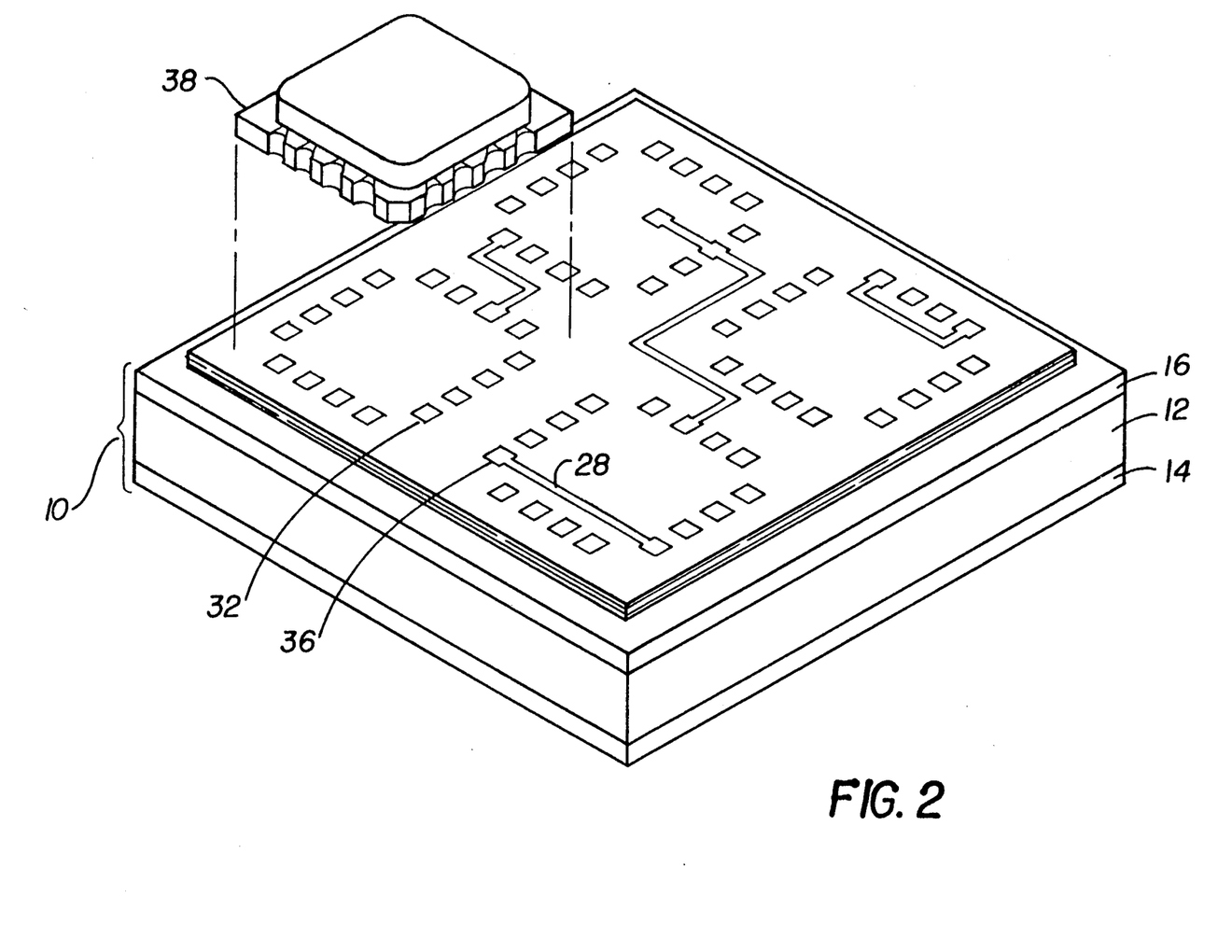
FIG. 2 illustrates a perspective view of the support structure of FIG. 1, additionally showing circuitry.
Figure 3:
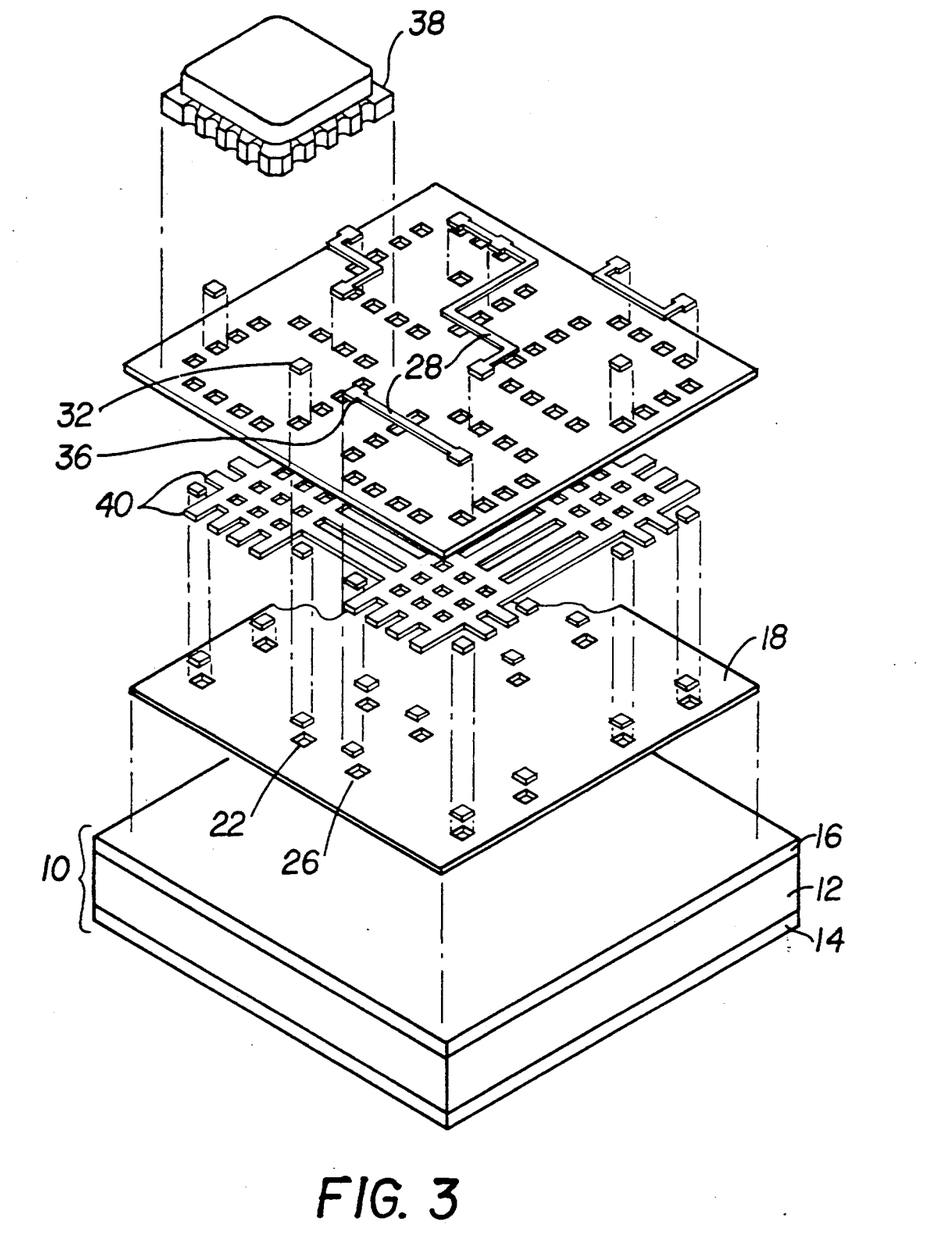
FIG. 3 illustrates an exploded perspective view of support structure and multi-layer circuitry, including a power plane, conductively-filled vias, and circuitry.

As shown in FIGS. 2 and 3, electrically conductive material 32 and 36 is employed to fill vias 22 and 26, respectively (vias 22 and 26 are shown in FIG. 1). Electrically conductive pathways 28 can be formed, for example, by applying a powdered metallic or other conductive material selectively to the surface of the dielectric layer 18. As will be appreciated, other methods for preparing the conductive pathways 28 known in the art can be employed. The vias 22 and 26 permit portions of the electrically conductive pathways 28 to be electrically connected to the electrically conductive substrate 10 by way of electrically conductive material 32 and 36.

In one embodiment of the present invention, several applications of layers of dielectric and conductive material are selectively silk screened onto the electrically conductive substrate 10 to provide for several thicknesses of the dielectric layer 18 and the electrically conductive via-filling layers 32 and 36. This is illustrated in FIG. 3. Preferably, up to about twelve or more layers of dielectric material and electrically conductive material are applied. Each layer can be applied separately and then dried and fired. Alternatively, all layers can be applied and then fired simultaneously.

Preferably, the electrically conductive pathways 28 are formed from a copper thick-film. A preferred copper material is DuPont 9924, available from E.I. DuPont de Nemours Co., Wilmington, Del.. Preferably the vias 22 and 26 are filled with a different electrically conductive material, e.g. DuPont 9927. When these materials are employed, a firing temperature of about 900° C. is required. The firing time is about 1 hour. The firing atmosphere is preferably non-oxidizing, e.g., nitrogen.

As shown in FIG. 3, several layers of conductive and dielectric materials can be provided to produce a board with multiple layers including, e.g., a power grid 40, selectively applied dielectric layers 18, and one or more conductive layers 28, 32 and 36. As illustrated in FIG. 3, the via-filling conductive material 32 and 36 comprises 7 and 4 layers of conductive material in vias 22 and 26, respectively. As will be appreciated by those skilled in the art, the electrically conductive pathways can also comprise multiple layers of conductive material separated by dielectric layers in order to create multilayer interconnect boards. Some or all of the conductive pathways 28 can be connected to the metallic substrate 10 by a via 22, or, to the power plane 40 by a via 26.

After firing, the described support structure is substantially wholly inorganic in nature, avoiding the problems, described above, associated with organic-containing or other low-temperature material support structures.

Discrete electronic components (not shown) can also be provided. A preferred method for mounting the discrete components on the electrically conductive pathways 28 is through the use of connection devices 38 (see FIG. 2), such as leadless ceramic chip carriers. Typically, these carriers are made of alumina or beryllia. As noted above, differential thermal expansion and contraction can lead to breakdown of the connection, typically a solder joint, between the electrically conductive pathways 28 and the chip carriers 38. Therefore, it is preferable that the linear coefficient of thermal expansion of the substrate be matched to that of the chip carriers. For example, if the chip carriers comprise alumina, then the linear coefficient of thermal expansion will be about 5.5 ppm/° C. to about 7 ppm/° C.. Therefore, the linear coefficient of thermal expansion of the substrate should be preferably between 5 and 8, more preferably between about 5.5 and 7, and most preferably between about 5.5 and about 6.3 ppm/° C.. As will be appreciated by those skilled in the art, the linear coefficient of thermal expansion for alumina varies depending on the purity of the alumina. For example, 90% pure alumina has a linear coefficient of about 6.1 ppm/° C., 94% alumina is about 6.3 ppm/° C. and 96% alumina is about 6.0 ppm/° C. (all calculated at 25° C.).

Materials in addition to copper clad molybdenum can be employed in the electrically conductive substrate. Such materials can include, for example, tantalum (6.5 ppm/° C.), iron (6.8 ppm/° C.), chromium (6 ppm/° C.), iridium (6 ppm/° C.), niobium (7 ppm/° C.), and osmium (5 ppm/° C.), or layers, alloys or combinations thereof. As will be appreciated by those skilled in the art, alloys or multi-layer substrates can be used, as long as the desired effective linear coefficient of thermal expansion is obtained. For example, certain iron nickel alloys including, e.g., Invar (TM), particularly copper or other metal-coated Invar, which can be manufactured to have specific linear coefficients of thermal expansion, can be employed. However, because coefficients of thermal expansion vary with temperature, it is important that materials selected have the proper coefficient of thermal expansion over the desired range of operating temperatures.

As will be appreciated, the circuitry components which are to be mounted on the support structure may have a linear coefficient of thermal expansion different from that of alumina. For example, rather than mounting chip carriers on a substrate, it is possible to mount bare integrated circuit chips on a substrate. In that case, substrate materials other than those listed above may be employed provided they have a matched linear coefficient of thermal expansion over the desired range of operating temperatures as well as the requisite properties, such as strength, smoothness, adhesive qualities and thermal conductivity.

A number of variations and modifications of the above-described method and device can also be used. Some or all of the dielectric layers and/or circuitry can be provided by methods other than thick film methods. In general, any additive or subtractive method previously known or used can be practiced in connection with applying material or devices to the described substrate. When the substrate includes layered or laminated materials, the layers or laminations can be placed on one or on both sides of the base. For example, copper can be clad on one side of a molybdenum base while the other side of the molybdenum base is brazed in the desired position. Other types of dielectrics can be used, such as vanadium oxide glasses. The circuitry can be applied without providing through holes and/or without providing electrical connections between circuitry components and the substrate. Although the present invention can be used to provide electrical connections to the substrate without the necessity for drilling through-holes in the substrate, the substrate, if desired, can be provided with through-holes for electrical connection, mounting or other purposes.

In light of the above description, a number of advantages of the present invention are apparent. The present invention provides for a substrate and method for providing and applying circuitry thereto which can withstand high temperature production processes, such as thick film processes, and which also provides for a matched linear coefficient of thermal expansion with respect to circuitry components, such as conductors and/or discrete components. The substrate is particularly useful when differential thermal expansion is problematic, such as highly integrated circuitry, fine line circuitry and/or high temperature applications. The invention provides for electrical connections between circuitry and the substrate without the necessity for drilling or forming holes through the substrate. The described metallic substrate provides for high thermal conductivity and, thus, enhanced heat dissipation. The invention provides for a substantially or totally inorganic system, thus avoiding vaporization, volatilization, melting, oxidizing or other degradation at high temperatures of processing or operation. The present invention includes applying dielectric to a substrate component by, e.g., silk-screening or other printing method, thus avoiding coating the entire substrate component with dielectric, which, typically, requires subsequent subtractive methods or drilling to provide electrical connections and which, typically, produces a rough or uneven surface.

While various embodiments of the present invention have been described in detail, it is apparent that modifications and adaptations of those embodiments will occur to those skilled in the art. However, it is to be expressly understood that such modifications and adaptations are within the spirit and scope of the present invention, as set forth in the following claims.

What is claimed is:

1. A support structure for supporting at least one circuitry component having an effective linear coefficient of thermal expansion, the support structure comprising:

an electrically conductive substrate comprising molybdenum and copper having first and second major surfaces and having a linear coefficient of thermal expansion substantially matched to the effective linear coefficient of thermal expansion of a circuitry component to be supported by the support structure;

a thick film layer of dielectric material covering at least a portion of said electrically conductive substrate for supporting a circuitry component, said dielectric material having at least one void for accommodating electrical connection therethrough between electrical contact means of a circuitry component to be supported by the support structure and said electrically conductive substrate, and having a linear coefficient of thermal expansion substantially matched to said effective linear coefficient of thermal expansion of said electrically conductive substrate; and at least one electrical interconnect means electrically connected to said electrically conductive substrate and disposed at lest partially within said at least one void for electrically connecting electrical contact means of a circuitry component to be supported by the support structure and said electrically conductive substrate.

2. A support structure, as claimed in claim 1, wherein:
   said substrate includes a first layer having a molybdenum component and a second layer, substantially adjacent to said first layer, having a copper component.

3. A support structure, as claimed in claim 1, wherein:
   said electrically conductive substrate has an effective linear coefficient of thermal expansion between about 5 and about 8 ppm/° C.

4. A support structure, as claimed in claim 1, wherein:
   said electrically conductive substrate has an effective linear coefficient of thermal expansion between about 5.5 and about 6.3 ppm/° C.

5. A support structure, as claimed in claim 1, wherein:
   said layer of dielectric material includes material selected from the group consisting of glasses, ceramics and mixtures thereof.

6. A support structure, as claimed in claim 1, wherein:
   said layer of dielectric material comprises horosilicate reinforced with alumina.

7. A support structure, as claimed in claim 1, wherein:
   said layer of dielectric material has a thickness of about 0.001 to about 0.003 inches.

8. A support structure, as claimed in claim 1, further comprising:
   at least one thick film electrically conductive pathway disposed on said layer of dielectric material; and
   said at least one electrical interconnect means is in substantial vertical alignment with said at least one electrical contact means.

9. A method for providing a support structure for supporting a circuitry component, the component having an effective coefficient of thermal expansion, the method comprising:
   providing an electrically conductive molybdenum and copper substrate having first and second major surfaces and having a coefficient of thermal expansion substantially matched to the effective coefficient of thermal expansion of a circuitry component to be supported by the support structure;

providing a thick film layer of dielectric material being suspended in a binder, said dielectric material covering at least a portion of said electrically conductive substrate and having a coefficient of thermal expansion substantially matched to said effective coefficient of thermal expansion of said electrically conductive substrate;

defining at least one void in said layer of dielectric material contemporaneously with said providing said layer of dielectric material;

heating said support structure in the absence of substantial volatilization of said dielectric material to a temperature sufficient to remove said binder wherein said dielectric material defines a first surface for supporting a circuitry component; and providing an electrically conductive material electrically connected to said electrically conductive substrate and disposed through said at least one void for electrically connecting electrical contact means of a circuitry component to be supported by the support structure and said electrically conductive substrate.

10. A method, as claimed in claim 9, wherein said step of providing an electrically conductive substrate includes:

providing a first layer of material having a molybdenum component; and providing a second layer of material substantially adjacent to said first layer having a copper component.

11. A method, ac claimed in claim 9, wherein said step of providing an electrically conductive substrate includes:

providing an electrically conductive substrate having an effective linear coefficient of thermal expansion between about 5 and about 8 ppm/° C.

12. A method, as claimed in claim 9, wherein said step of providing and electrically conductive substrate includes:

providing an electrically conductive substrate having an effective linear coefficient of thermal expansion between about 5.5 and about 6.3 ppm/° C.

13. A method, as claimed in claim 9, further comprising the step of:

providing at least one thick film electrically conductive pathway on said layer of dielectric material.

14. A method, as claimed in claim 9, wherein said steps of providing said dielectric material and said electrically conductive material through said at least one void include:

selectively applying said dielectric material and said electrically conductive material by a silk screening process.

15. A method, as claimed in claim 9, wherein said step of providing a layer of dielectric material includes:

providing a layer of dielectric material selected from the group consisting of glasses, ceramics and mixtures thereof.

16. A method, as claimed in claim 9, wherein said step of providing a layer of dielectric material includes;

providing a layer of dielectric material comprising borosilicate glass reinforced with ceramic fibers.

17. A method, a s claimed in claim 9, wherein said step of providing a layer of dielectric material includes:

providing a layer of dielectric material having a thickness of from about 0.001 to about 0.003 inches.

18. A method, as claimed in claim 9, wherein said step of providing a layer of dielectric material includes:

printing a layer of dielectric material on at least a portion of a major surface of said electrically conductive substrate and firing at a temperature above 400° C.

19. A method, as claimed in claim 9, further comprising the step of:

substantially vertically aligning said at least one void with electrical contact means of a circuitry component to be supported by the support structure.

20. A method, as claimed in claim 9, wherein:

said steps of providing a layer of dielectric material and defining said at least one void comprise a silk screening process.

21. A circuit board comprising:

at least one circuitry component having an effective coefficient of thermal expansion;

an electrically conductive molybdenum and copper substrate having first and second major surfaces and having a coefficient of thermal expansion substantially matched to said effective coefficient of thermal expansion of said at least one circuitry component;

a thick film layer of dielectric material covering at least a portion of said electrically conductive substrate and having a coefficient of thermal expansion substantially matched to said effective coefficient of thermal expansion of said at least one circuitry component, said layer of dielectric material forming a first surface for supporting said at least one circuitry component; and at least one electrical interconnect means electrically connected to said electrically conductive substrate and disposed at least partially within at least one void formed through said layer of dielectric material for electrically connecting electrical contact means of said at least one circuitry component and said electrically conductive substrate.

22. A circuit board, as claimed in claim 21, wherein:

said at least one circuitry component comprises a leadless ceramic chip carrier.

23. A circuit board, as claimed in claim 21; wherein:

said electrically conductive substrate includes a first layer having a molybdenum component and the second layer substantially adjacent to said first layer having a copper component.

24. A circuit board, as claimed in claim 21, wherein:

said electrically conductive substrate has an effective coefficient of thermal expansion between about 5 and about 8 ppm/° C.

25. A circuit board, as claimed in claim 21, wherein:

said electrically conductive substrate has an effective coefficient of thermal expansion between about 5.5 and about 6.3 ppm/° C.

26. A circuit board, as claimed in claim 21, wherein:

said layer of dielectric material includes material selected from the group consisting of glasses, ceramics and mixtures thereof.

27. A circuit board, as claimed in claim 21, wherein:

said layer of dielectric material includes borosiliate glass and ceramic filler.

28. A circuit board, as claimed in claim 21, wherein:

said layer of dielectric material has a thickness of from about 0.001 to about 0.003 inches.

29. A method for providing a circuit board comprising:

providing a circuitry component having an effective coefficient of thermal expansion;

providing an electrically conductive substrate having first and second major surfaces and having a coefficient of thermal expansion substantially matched to said effective coefficient of thermal expansion of said circuitry component;

selectively applying a thick film layer of dielectric material, said dielectric material being suspended in a binder, to a portion of said electrically conductive substrate thereby forming at least one via hole in an area wherein dielectric material is not applied;

heating the circuit board to a temperature sufficient to remove said binder and form a first surface for supporting said circuitry component; and providing an electrically conductive material through said at least one via hole for electrical connection between electrical contact means of said circuitry component and said electrically conductive substrate.

30. A method, as claimed in claim 33, wherein:
said step of providing said circuitry component and said step of providing said electrically conductive substrate include substantially matching said coefficient of thermal expansion of said electrically conductive substrate to said effective coefficient of thermal expansion of said circuitry component at temperatures greater than about 200° C.

31. A method, as claimed in claim 29, wherein said step of heating comprises the step of:
heating the circuit board in the absence of substantial volatilization of said dielectric material to a temperature greater than 400° C.

32. A method, as claimed in claim 29, wherein said step of providing an electrically conductive substrate comprises:
providing an electrically conductive substrate comprising material selected form the group consisting of molybdenum, copper, tantalum, iron, chromium, iridium, niobium, and osmium.

33. A method, as claimed in claim 29, wherein said step of providing an electrically conductive substrate comprises:
providing a first layer of material having a molybdenum component;
providing a second layer of material substantially adjacent to said first layer of material and having a copper component.

34. A method, as claimed in claim 29, wherein said step of providing an electrically conductive substrate comprises:
providing a substrate having an effective coefficient of thermal expansion between about 5 and about 8 ppm/° C.

35. A method, as claimed in claim 29, wherein said step of providing an electrically conductive substrate comprises:
providing an electrically conductive substrate having an effective coefficient of thermal expansion between about 5.5 and about 6.3 ppm/° C.

36. A method, as claimed in claim 29, wherein said step of selectively applying a layer of dielectric material comprises:
applying a layer including material selected from the group consisting of glasses, ceramics and mixtures thereof.

37. A method, as claimed in claim 29, wherein said step of selectively applying a layer of dielectric material comprises:
applying a layer including borosilicate glass with ceramic filler.

38. A method, as claimed in claim 29, wherein said step of selectively applying a layer of dielectric material comprises:
applying a layer of dielectric material having a thickness from about 0.001 to about 0.003 inches.

39. A method, as claimed in claim 34, wherein:
said step of selectively applying a layer of dielectric material comprises printing a layer of dielectric material on at least a portion of a major surface of said electrically conductive substrate; and
said step of providing an electrically conductive material through said at least one via hole comprises selectively printing said electrically conductive material on at least a portion of said dielectric material.

40. The method of claim 39 wherein said printing steps are accomplished by silk screening.

41. A support structure for supporting a circuitry component having an effective linear coefficient of thermal expansion, the support structure comprising:
an electrically conductive substrate having first and second major surfaces and having a linear coefficient of thermal expansion substantially matched to the effective linear coefficient of thermal expansion of a circuitry component on the support structure;
a layer of dielectric material covering a portion of said substrate and forming a first surface for supporting a circuitry; and
said layer of dielectric material having at least one via hole and being in substantial vertical alignment with electrical contact means of said circuitry component on the support structure for permitting an electrical connection between said electrical contact means and said electrically conductive substrate.

42. A support structure, as claimed in claim 41, wherein:
said electrically conductive substrate is characterized in that said linear coefficient of thermal expansion of said electrically conductive substrate is substantially matched to the effective linear coefficient of thermal expansion of said circuitry component on the support structure at temperature greater than 200° C.

43. A support structure, as claimed in claim 41, wherein:
said electrically conductive substrate has an effective linear coefficient of thermal expansion between about 5 and about 8 ppm/° C.

44. A support structure, as claimed in claim 41, wherein:
said electrically conductive substrate has an effective linear coefficient of thermal expansion between about 5.5 and about 6.3 ppm/° C.

45. A support structure, as claimed in claim 41, wherein:
said electrically conductive substrate comprises material selected from the group consisting of copper, molybdenum, tantalum, iron, chromium, iridium, niobium, and osmium.

46. A support structure, as claimed in claim 41, wherein:

said electrically conductive substrate includes a first layer having a molybdenum component and a second layer, substantially adjacent to said first layer, having a copper component.

47. A support structure, as claimed in claim 41, wherein:
said layer of dielectric material includes material selected from the group consisting of glasses, ceramics and mixtures thereof.

48. A support structure, as claimed in claim 41, wherein:
said layer of dielectric material comprises borosilicate reinforced with alumina.

49. A support structure, as claimed in claim 41, wherein:
said layer of dielectric material has a thickness of about 0.001 to about 0.003 inches.

50. A support structure for supporting one or more circuitry components having an effective linear coefficient of thermal expansion, the support structure comprising:
an electrically conductive substrate having a coefficient of thermal expansion substantially matched to the effective coefficient of thermal expansion of a circuitry component to be supported by the support structure;
a thick film layer of dielectric material covering at least a portion of said electrically conductive substrate, having one or more voids defined therethrough, and having a linear coefficient of thermal expansion substantially matched to the effective linear coefficient of thermal expansion a circuitry component to be support by the support structure; and
one or more electrical interconnect means electrically connected to said electrically conductive substrate and disposed at least partially within said one or more voids for electrically connecting electrical contact means of one or more circuitry components to be supported by the support structure and said electrically conductive substrate.

51. A support structure, as claimed in claim 50, wherein at least one of said one or more voids is in substantial vertical alignment with electrical contact means of one or more circuitry components.

52. A support structure, as claimed in claim 50, and further comprising one or more thick film electrically conductive pathways disposed on said dielectric material.

53. A support structure, as claimed in claim 52, wherein said one or more electrically conductive pathways comprise a conductive material suspended in a binder.

54. A support structure, as claimed in claim 52, wherein at least one of said one or more electrically conductive pathways is electrically connected to said one or more electrical interconnect means.

55. A support structure, as claimed in claim 52, wherein at least one of said one or more electrically conductive pathways is electrically connected to electrical contact means of one or more circuitry components.

56. A support structure, as claimed in claim 52, wherein said one or more voids are in substantial vertical alignment with electrical contact means of one or more circuitry components and at least one of said one or more conductive pathways is electrically connected to contact means of one or more circuitry components.

57. A support structure for supporting one or more circuitry components having an effective linear coefficient of thermal expansion, the support structure being made by the following process:
providing an electrically conductive substrate having a coefficient of thermal expansion substantially matched to the effective coefficient of thermal expansion of a circuitry component to be supported by the support structure;
applying a thick film layer of dielectric material to at least a portion of said electrically conductive substrate;
defining one or more voids in the layer of dielectric material contemporaneously with said step of applying said layer of dielectric material; and
providing an electrically conductive material electrically connected to said electrically conductive substrate and disposed through said one or more voids for electrically connecting electrical contact means of one or more circuitry components to be supported by the support structure and said electrically conductive substrate.

58. A support structure, as claimed in claim 57, the process further comprising the step of substantially vertically aligning at least one of said one or more voids with contact means of one or more circuitry components to be supported by the support structure.

59. A support structure, as claimed in claim 57, the process further comprising the step of applying at least one thick film electrically conductive pathway on said dielectric material.

60. A support structure, as claimed in claim 59, wherein said step of applying said at least one electrically conductive pathway to said dielectric material is contemporaneous with said step of providing said electrically conductive material through said one or more voids.

61. A support structure, as claimed in claim connecting said at least one electrically conductive pathway 59, the process further comprising the step of electrically to said electrically conductive material.

62. A support structure, as claimed in claim 59, the process further comprising the step of connecting said at least one electrically conductive pathway to contact means of one or more circuitry components to be supported by the support structure.

63. A support structure, as claimed in claim 59, the process further comprising the step of substantially vertically aligning at least one of said one or more voids with contact means of one or more circuitry components to be supported by the support structure and electrically connecting said contact means to one of said at least one electrically conductive pathway.

64. A support structure, as claimed in claim 59, wherein:
said electrically conductive material that is provided through said at least one void is formed from a first conductive material suspended in a first binder;
said at least one electrically conductive pathway is formed from a second conductive material suspended in a second binder; and
said dielectric material is suspended in a third binder.

65. A support structure, as claimed in claim 64, the process further comprising the step of:
heating the support structure in the absence of substantial volatilization of said dielectric material and said electrically conductive substrate to a temperature sufficient to remove said third binder.

66. A support structure, as claimed in claim 64, the process further comprising the step of:

heating the support structure in the absence of substantial volatilization of said dielectric material and said electrically conductive substrate to a temperature sufficient to remove said first and second binders.

67. A support structure, as claimed in claim 64, the process further comprising the step of:

heating the support structure in the absence of substantial volatilization of said dielectric material and said electrically conductive substrate to a temperature sufficient to remove said first, second and third binders.

68. A support structure, as claimed in claim 64, the process further comprising the step of:

heating the support structure in the absence of substantial volatilization of said dielectric material and said electrically conductive substrate to a temperature sufficient to simultaneously remove said first, second and third binders.

69. A support structure, as claimed in claim 63, wherein said dielectric material is characterized by having a coefficient of thermal expansion which is substantially matched to said coefficient of thermal expansion of said electrically conductive substrate.

* * * * *